United States Patent

Mosch et al.

[15] 3,702,954

[45] Nov. 14, 1972

[54] SEMICONDUCTOR COMPONENT AND METHOD OF ITS PRODUCTION

[72] Inventors: Willi Mosch, Munich; Gerhard Lutz, Erlangen; Lothar Pütter, Munich; Erich Waldkötter, Munich; Heinz Martin, Munich, all of Germany

[73] Assignee: Siemens Aktiengesellschaft, Berlin and Munchen, Germany

[22] Filed: June 22, 1971

[21] Appl. No.: 155,615

Related U.S. Application Data

[63] Continuation of Ser. No. 746,614, July 19, 1968, abandoned.

[30] Foreign Application Priority Data

July 21, 1967 Germany..........P 16 14 567.8

[52] U.S. Cl...........317/234 R, 317/234 N, 317/234 P

[51] Int. Cl...............................................H01l 5/00

[58] Field of Search......................................317/234

[56] References Cited

UNITED STATES PATENTS

| | | | |
|---|---|---|---|
| 3,500,136 | 3/1970 | Fischer | 317/234 |
| 2,795,745 | 6/1957 | Huard | 317/235 |
| 2,882,462 | 4/1959 | Zierdt | 317/235 |
| 2,894,183 | 7/1959 | Fermanian | 317/235 |
| 2,981,875 | 4/1961 | Kelly et al. | 317/235 |
| 3,436,603 | 4/1969 | Vogt | 317/100 |

*Primary Examiner*—John W. Huckert
*Assistant Examiner*—E. Wojciechowicz
*Attorney*—Arthur E. Wilfond

[57] ABSTRACT

A semiconductor p-n junction device having a monocrystalline body, preferably of silicon, is equipped with connector leads which are punched out of sheet material and are soldered to the electrodes of the device. Each connector lead has at least one springy clamping lug protruding toward the other connector lead and located beside a clamping lug of another connector lead. The semiconductor body is clamped between the lugs of two superpositioned adjacent connector leads and is soldered thereto.

1 Claim, 11 Drawing Figures

SEMICONDUCTOR COMPONENT AND METHOD OF ITS PRODUCTION

This application is a streamlined continuation of application Ser. No. 746,614, filed July 19, 1968.

Our invention relates to a semiconductor p-n junction device with a semiconductor body of monocrystalline material, preferably silicon, whose electrodes, pertaining to the p-type and n-type regions of the crystalline body, are soldered to respective connector leads of metal formed by punchings of foil or sheet material. A similar technique is described in copending application Ser. No. 719.193, filed Apr. 5, 1968 of W. Mosch et al.

The manufacture of such semiconductor devices has involved considerable difficulties and cost due mainly to the amount of work needed prior to the soldering operation for properly mounting the usually minute semiconductor body between the connector leads.

It is an object of our invention to minimize such difficulties and cost.

To this end, and in accordance with our invention, we provide each connector lead in a semiconductor device of the above-mentioned kind with one or more springy clamping lugs directed toward the other connector lead and located beside the clamping lug of the other connector lead. We further clamp the semiconductor body between the springy clamping lugs of two adjacent connector leads and solder the body to the lugs.

The production of such a semiconductor device is considerably simplified because the connector leads, including any interconnecting bridging portion, may be punched out of a strip of sheet material in such a manner that all of the connector leads still remain interconnected at one of the respective ends through an auxiliary bridging piece. This bridging piece not only secures the spatial coordination of the individual connector leads during soldering operation, but also has the consequence that when the individual connector leads are being bent out of their originally common plane, they will spring back into this plane. For preparing the soldering of the semiconductor bodies to the connector leads, this being preferably done by immersion soldering, the semiconductor bodies need only be clamped between the lugs of two adjacent connector leads. The restoring force then exerted by the clamping lugs, if the sheet from which they are punched is appropriately dimensioned, is sufficient to hold the semiconductors in the desired position during the soldering process. This results in a cohesive unit across the clamping device or the auxiliary bridge, which makes possible simultaneously effecting additional method steps for a plurality of components. This includes the simultaneous etching, varnishing, and the casting with an appropriate insulator mass wherefrom only one piece of the connector leads still protrudes. Preferably, the individual structural components of the unit, which may be produced in a manner which is different than the aforedescribed, are placed into an extrusion mold and simultaneously pressed in one single operational step and, following the hardening of the insulator mass, are severed from each other, in many steps, either sequentially or concomitantly. The connector leads are thereafter removed from the clamping device, or severed from the auxiliary bridge. The latter may be accomplished in one single punching process. We obtain thereby a larger number of finished structural components, for example already connected rectifier bridges.

Particular advantages are offered by the invention if the clamping lugs are punched, with at least one portion of the connector leads, out of the strip of sheet material in such a manner that said clamping lugs protrude from both sides of a relatively wide auxiliary bridge. After the completion of the individual structural components, which are attached to said auxiliary bridge, the connector leads are severed in a single step from said auxiliary bridge. It is particularly advantageous if individual severing points are not in parallel with the longitudinal axis of the auxiliary bridge but rather are diagonal thereto and, hence, parallel to the longitudinal direction of the connector leads so that elongated connector leads develop around the width of the auxiliary bridge. The length of the connector leads, through which the individual clamping lugs are first connected with the auxiliary bridge, may be kept very short, thus keeping the spring force which clamps the individual semiconductor bodies relatively high. It is particularly preferred in this double utilization of the auxiliary bridge to arrange always the connector leads, which discharge from both its sides, so that one connector lead emerging from one side is punched out from the interspace between two connector leads, emerging from the other side.

As a rule, it will be sufficient if one of the two connector leads required for holding the crystalline semiconductor body is provided with but a single lug which projects between two lugs of the other connector lead. Each of the two connector leads, however, may also be given any desired number of lugs which are arranged in meshing relation to the lugs of the other lead. Furthermore, electrically parallel connected semiconductor bodies may be soldered between these teeth or lugs of the mesh arrangements. The lugs may be given any desired shape, for example rectangular, triangular or semicircular shape.

A simplified solution is afforded by bending the end of a connector lead with its clamping lug, in such a way, from a common plane into a plane running approximately in parallel thereto, that said clamping lug will be positioned above a clamping lug of the adjacent connector lead. This makes it possible to clamp one semiconductor between only two clamping lugs of two adjacent connector leads.

It is even more preferable to place the individual semiconductor bodies between the directly adjacent or slightly distanced ends of the clamping lugs which are squared against the connector leads, although this tilts the individual semiconductor bodies and makes them assume a slightly inclined position with respect to the auxiliary bridge. But, provided the distance of the ends of two clamping lugs wherebetween such a semiconductor has been placed, is less than the thickness of the semiconductor body, the latter cannot fall out.

As a rule, pre-fabricated, possibly also tested semiconductor components are placed between the lugs and the connector leads. Thus, the semiconductor components are comprised of a semiconductor body lying between two connectors. The semiconductor surface is protected, by conventional varnish coating, against detrimental influences.

Semiconductor bodies positioned between such connector bodies are usually obtained by dividing large area discs provided with appropriate p-n junctions and, for example nickel-plated connecting electrodes. It has now been found that such semiconductor bodies may be soldered directly between the lugs, i.e. without connector bodies, prior to additional surface treatment. Following the soldering process, the entire unit is etched, provided with a surface protecting varnish and, finally, enclosed by an insulating pressing or casting material.

Contrary to expectations, the connection of the semiconductor bodies with the clamping lugs was found practicable by an immersion soldering process with the aid of conventional fluxing agents, even when pre-fabricated components coated with a protective layer of varnish are to be soldered. The immersion soldering not only considerably reduces the production costs but also secures a better connection, which is free of shrinkage holes. In designing the clamping lugs, care must be taken that the same are smaller than the surfaces of the semiconductor bodies or the semiconductor components so that the semiconductor components cannot become short-circuited through solder bridges between the clamping lugs.

The original material used for the clamping lugs and connector leads is preferably tin plate and, if etching must again be effected following the immersion soldering process, a chemically nickel-plated iron sheet.

The solder is preferably a lead-tin alloy with about 90 percent lead. The melting point of the alloy is far enough removed from the maximum permissible operational temperature of the finished structural components. The solder bath temperature may be around 350° to 360°C, even when the connector plates of prefabricated components are soldered to the semiconductor body, with a lead/tin alloy of 95 to 99 percent lead.

Particular advantages are offered by the invention if at least a middle connector lead is provided between two outer connector leads of a single device unit, and if the middle connector lead is provided with lugs complementary to those of the respective adjacent connector leads. A semiconductor body or several such bodies operating electrically in parallel can then be soldered between the lugs of two such adjacent connector leads. The semiconductor bodies may have respective regions of the same doping type in connection with one and the same connector lead, or differently doped regions of the respective semiconductors may be connected with the same connector lead, depending upon whether a series connection composed of at least two semiconductor bodies or a mid-point circuit is involved, or whether the connector lead is to constitute a direct-voltage terminal or an alternating-voltage terminal of a bridge network.

Adjacent connector leads of a unit having several such connector leads, may extend toward one and the same side away from the lugs or they may extend alternately toward different, mutually opposed directions away from these lugs. Accordingly the connector leads may be provided with bridging pieces on one or on both sides, and individual bridging pieces may serve the function of electrical connections which are not severed off upon completion of the structural unit.

In an arrangement in which the connector leads alternately extend in opposed directions away from the lugs, the semiconductor bodies are preferably soldered between the lugs of adjacent connector leads in such a manner that all connector leads protruding toward one side constitute direct-current terminals, and all connector leads protruding to the other side constitute alternating-current terminals of a multiphase rectifier bridge.

The structural unit obtained after performing the soldering operation may be embedded in an insulating casting or pressing mass out of which only the connector leads protrude. However the soldered unit may also be inserted into a flat housing of synthetic plastic whose lateral walls are provided with guide-slots for the two outermost connector leads; and the inner space of the housing may then be filled with a casting or pressing mass. Suitable for this purpose are thermoplastics or duroplastics, a hardener and a softener being preferably added to the latter. A further addition of silicone resin permits making these masses virtually impermeable to water.

Several embodiments of the invention will be further described by way of example with reference to the accompanying drawing in which:

FIG. 1 shows an embodiment with a semiconductor body fastened between two connector leads;

FIG. 1*a* is a modified section of the embodiment of FIG. 1;

Figure 1:
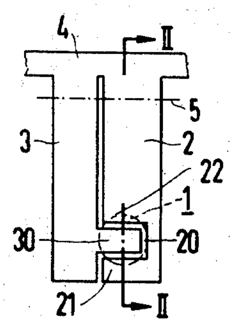
Figure 1A:
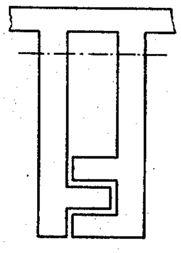

Functionally corresponding items are designated by the same reference characters in all figures. Thus, the semiconductor member is denoted by 1, the connector leads by numerals 2 and 3, the auxiliary bridging pieces by numeral 4, and the housing by numeral 6.

FIG. 1 illustrates two connector leads 2 and 3 which project away from an auxiliary bridging piece 4 and extend substantially parallel to each other, being separated by a relatively narrow, punched-out slit.

Figure 2:
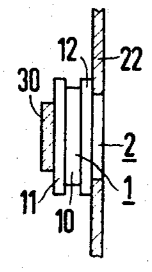
FIG. 2 is a section along the line II—II in FIG. 1.

The connector lead 3 has a protruding terminal lug 30 which protrudes into a corresponding recess 20 surrounded by terminal protrusions or lugs 21 and 22. The semiconductor member 1 is located between the protrusions 21, 22 and the protrusion 30. The member 1, as particularly apparent from FIG. 2, consists of a semiconductor body 10 of monocrystalline material, particularly silicon, having at least one p-n junction to whose electrodes there are fastened, for example by soldering, particular electrode bodies 11 and 12. The semiconductor member is held in the position shown in FIG. 2 by the restoring force of the connector leads 2 and 3 bent out of their originally common plane, and this holding effect persists during the subsequent soldering operation. After such soldering operation, the unit illustrated in FIG. 1 can be cut along the line 5.

Figure 3:
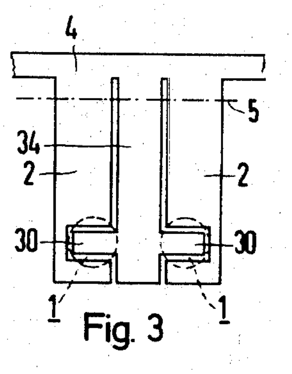
FIG. 3 shows an embodiment with two semiconductor bodies between three connector leads.

FIG. 3 shows a twin device with a middle connector lead 34 which is in meshing relation on two sides through protruding lugs 30 with complementary recesses of two adjacent connector leads 2. Semiconductor members denoted by 1 are located between each two adjacent connector leads. These members may be connected with the middle connector lead 34 at respective regions doped for the same type of conductivity, or doped for different types of conductivity respectively. Consequently, this unit constitutes a midpoint circuit or two branches of a rectifier bridge.

The three connector leads are originally connected with each other by an auxiliary bridging piece 4 which is severed off along the line 5 after the soldering operation or, as the case may be, after embedding the unit by pressing into an insulating material.

Figure 4:
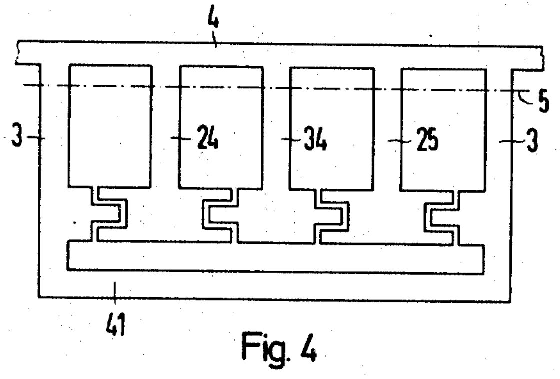
FIG. 4 is a plan view of a punching for a rectifier bridge with an internal connection of the two outer connector leads.
Figure 6:
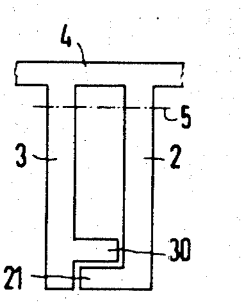
FIG. 6 is an embodiment with a different basic shape of the punching section.

The punching shown in FIG. 4 can be used for constructing a rectifier bridge. For this purpose, the semiconductor bodies are placed between the individual connector leads in such a manner that the connector lead 24 interconnects regions having the same type of doping, while the connector lead 25 interconnects regions having all the same doping of the other type. These two connector leads then constitute the direct-current terminals of the bridge, whereas the alternating-voltage terminals are formed by the connector leads 3 and 34. The two outer connector leads 3 are connected with each other through a bridging piece 41, so that only the middle connector lead 34 and one of the two outer connector leads 3 need be connected with the alternating-voltage supply lines. It is advisable to select the spacing between the connecting leads so that it corresponds to the standardized raster dimension (2.5 mm or n. 2.5).

Figure 5:
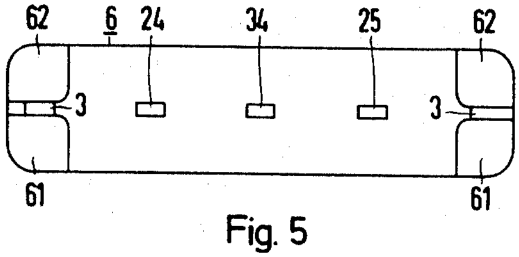
FIG. 5 is a cross section through a housing with a rectifier bridge according to FIG. 4.

FIG. 5 shows in cross section a housing with a rectifier bridge formed with the aid of a punching according to FIG. 4. The punching is held in the housing 6 at the two outer connector leads 3 between projections 61 and 62.

Figure 7:
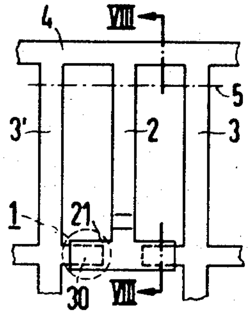
FIG. 7 is an embodiment according to FIG. 3, with the basic section illustrated in FIG. 6.
Figure 8:
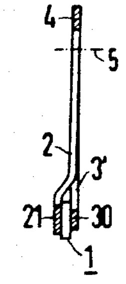
FIG. 8 is a section along the lines VIII—VIII of the arrangement shown in FIG. 7.

In the aforedescribed embodiments of the invention, also described in copending application Ser. No. 719,193 of Mosch et al., the semiconductor body is positioned with two lateral edge regions on two terminal lugs of the same connector lead which are spaced at a slight distance from each other. The basic form shown in FIG. 1 permits the clamping of any semiconductor body between only two terminal lugs 21 and 30 of two adjacent connector leads 2 and 3. We achieve this purpose herein by bending the end of one connector lead 2, together with a terminal lug 21, from the mutual plane into a plane which extends approximately in parallel to the aforementioned plane, so that the lug 21 is now positioned above the terminal lug 30 of the adjacent connector lead, as shown in FIG. 7 in connection with a twin component according to FIG. 3. The section shown in FIG. 8, along lines VIII—VIII of FIG. 7, clearly shows the curvature or bend of the connector lead 2, compared to connector lead 3, or 3'. The bend is preferably so produced that the connector leads 2 and 3' , which are interconnected by the auxiliary bridge 4, with a semiconductor body 1 clamped between them, together form an angle, even though the latter is very small.

The aforedescribed possibility of clamping a semiconductor body directly between two overlapping terminals of two adjacent connector leads is also possible in the embodiments illustrated in FIG. 1 to 4.

Figure 9:
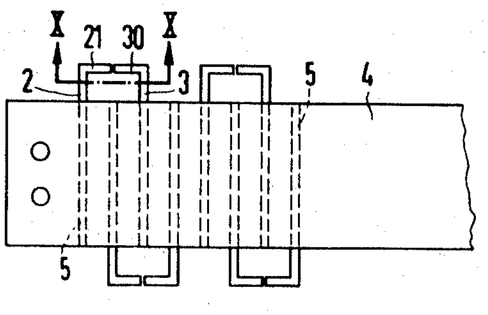
FIG. 9 is a punching portion with connector leads protruding on both sides.
Figure 10:
FIG. 10 is a section along the line X—X in FIG. 9.

FIG. 9 shows a punching with a relatively wide auxiliary bridge piece 4 and two connector leads 2, 3 extending therefrom, at both sides. This relates to a punching which is used for producing simple rectifiers. As is more clearly seen in FIG. 10, a clamped-in semiconductor body 10 lies between the terminal lugs 21 and 30 which have almost no distance between them at the section point, at a slight angle to the auxiliary bridge 4. Following the soldering of the semiconductor bodies with their terminal lugs and, possibly, some additional operational steps which may become necessary, the auxiliary bridge 4 is divided along the dotted line 5, in a single work step. Thus, the material of the auxiliary bridge serves as an extention of the connector leads.

The aforedescribed method can also be used in the production of thyristors. The semiconductor is so designed that two electrodes are positioned adjacent to one another at one of its two sides, i.e. the control electrode and one of the two main electrodes. The other main electrode is positioned on the other side of the semiconductor disc. The semiconductor body is preferably given a shape other than a circle. If one connector lead is then provided with an appropriate imprint or with other known means for position orientation, a specific position of the two electrodes located on one side of the semiconductor body is then obtainable relative to the connector lead and thereby to the auxiliary bridge with connects all connector leads.

The punching section is so selected in this instance, that the connector leads which are to be connected with one main electrode protrude from one side of the auxiliary bridge and two additional connector leads protrude from the opposite side of the auxiliary bridge. In order to connect with the two other electrodes of the semiconductor body assigned to them, that is with the second main electrode and with the control electrode, the last-mentioned connector leads are bent by 180° over the auxiliary bridge, toward the semiconductor body, until their ends impinge upon the appropriate electrodes of the semiconductor body. The connector leads are then held in this position by a clamping device in such a manner that the semiconductor remains in a desired position through the spring force exerted by the connector leads. If one begins with a punching section with a number of adjacent connector leads, then a great amount of thyristors may be produced by simultaneous operational steps, in the afore-described manner, with the aid of appropriate multi-purpose tools.

We claim:

1. With an electric semiconductor device, comprising a semiconductor body of monocrystalline material having at least one p-n junction and two electrodes with sheet-metal connector leads soldered to said respective electrodes, the improvement according to which each of said connector leads comprises at least one springy clamping lug directed toward the other connector lead and located above the clamping lug of said other lead, said semiconductor body being clamped between the springy clamping lugs of two adjacent connector leads, and solder bonds joining said body with said lugs.

* * * * *